(12) United States Patent
Kim

(10) Patent No.: US 8,877,621 B2
(45) Date of Patent: Nov. 4, 2014

(54) LOW RESISTIVITY GATE CONDUCTOR

(75) Inventor: Hoon Kim, Grand Cayman (KY)

(73) Assignee: GLOBALFOUNDRIES Inc., Grand Cayman (KY)

(*) Notice: Subject to any disclaimer, the term of this patent is extended or adjusted under 35 U.S.C. 154(b) by 147 days.

(21) Appl. No.: 13/603,513

(22) Filed: Sep. 5, 2012

(65) Prior Publication Data

US 2014/0061925 A1   Mar. 6, 2014

(51) Int. Cl.
*H01L 21/4763* (2006.01)
*H01L 21/3205* (2006.01)
*H01L 29/76* (2006.01)
*H01L 29/94* (2006.01)
*H01L 23/58* (2006.01)
*H01L 29/66* (2006.01)

(52) U.S. Cl.
CPC ......... *H01L 29/66477* (2013.01); *H01L 23/58* (2013.01)
USPC ........... 438/585; 438/587; 438/595; 257/412; 257/331

(58) Field of Classification Search
USPC ............... 438/585, 587, 595; 257/412, 331
See application file for complete search history.

(56) References Cited

U.S. PATENT DOCUMENTS

| | | | |
|---|---|---|---|
| 8,084,824 B2* | 12/2011 | Yu et al. | 257/369 |
| 8,436,404 B2* | 5/2013 | Bohr et al. | 257/288 |
| 2003/0216038 A1* | 11/2003 | Madhukar et al. | 438/648 |
| 2005/0275042 A1* | 12/2005 | Hwang et al. | 257/401 |
| 2013/0299922 A1* | 11/2013 | Choi et al. | 257/412 |
| 2013/0334690 A1* | 12/2013 | Tsai et al. | 257/751 |
| 2014/0008720 A1* | 1/2014 | Xie et al. | 257/331 |

* cited by examiner

*Primary Examiner* — Luan C Thai
(74) *Attorney, Agent, or Firm* — Darrell L. Pogue; Keohane & D'Alessandro PLLC

(57) ABSTRACT

Embodiments of the invention provide an approach for bottom-up growth of a low resistivity gate conductor. Specifically, a low resistivity metal (e.g., aluminum or cobalt) is selectively grown directly over metal layers in a set of gate trenches using a chemical vapor deposition or atomic layer deposition process to form the gate conductor.

20 Claims, 6 Drawing Sheets

LOW RESISTIVITY GATE CONDUCTOR

BACKGROUND

1. Technical Field

This invention relates generally to the field of semiconductors, and more particularly, to formation of a low resistivity gate conductor in a semiconductor gate stack.

2. Related Art

Increased performance of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture of metal oxide semiconductor (MOS) transistor semiconductor devices, such as those used in a complementary metal oxide semiconductor (CMOS), it is often desired to increase movement of electrons in N-type MOS device (NMOS) channels and to increase movement of positive charged holes in P-type MOS device (PMOS) channels. In addition, during such design, it is often also desired to reduce the depletion of carriers in an area of the NMOS and PMOS device gate electrodes near the dielectric materials during inversion, while minimizing parasitic resistance, and providing an appropriately large threshold or voltage.

Furthermore, it is desirous to manufacture smaller transistors to increase the component density on an integrated circuit. It is also desirous to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

One device structure which has been found to provide good device characteristics such as breakdown voltage, output currents, and pinch-off voltage is a double recessed transistor, an example of which is shown by FIGS. 1-3. As shown first in FIG. 1, a prior art device 10 includes a plurality of trenches 12 and 14 formed in a dielectric material 16, for example, via a replacement metal gate (RMG) process. Dielectric material 16 is removed, and metal layers 18 and 20 are formed within trenches 12 and 14, respectively. In one example, metal layer 18 is a p-metal, which may include tungsten (W) surrounded by titanium nitride (TiN). Metal layer 20 is an n-metal, which may include W surrounded by TiN and titanium carbide (TiC).

Next, as shown in FIG. 2, a barrier layer (e.g., TiN) 24 is formed over metal layers 18 and 20, a pair of spacers 19, and over dielectric material 16 (e.g., by introducing a combination of WF6, a nitrogen-containing gas, H2, and a plasma). Barrier layer 24 is conventionally a layer of metallic material (e.g., TiN, due to its high selectivity to the IDL etch process), or a dielectric material that is employed as a masking layer. Barrier layer 24 may also be a silicon nitride layer, a silicon oxide layer, a silicon oxynitride layer, or a combination thereof.

A high resistance nucleation layer 26 is then formed over barrier layer 24 (e.g., by introducing a combination of WF6, H2 and a plasma), and a W fill 28 is deposited over nucleation layer 26 within trenches 12 and 14 to form gate conductors. Conventionally, a SiH4+WF6, or B2H6+WF6 step is used for depositing nucleation layer 26 for subsequent thermal CVD-W formation. However, for thin W layers, e.g., less than 100 nanometers thick, such as in W gate stacks, the incorporation of nucleation layer 26 causes higher sheet resistance. This becomes particularly undesirable because the trend for future devices is to have gates with smaller gate lengths and lower resistivity. Furthermore, because the nucleation layer SiH4+WF6, or B2H6+WF6 step is thermally driven, the nucleation property is substrate dependent. This results in rough surface morphology on certain substrates, such as TiN. Rough surface morphology is not desirable because it will affect the subsequent patterning steps required for fabricating gate structures.

Next, W fill 28 is etched, forming the structure shown in FIG. 3. As a result of this process, only a small portion of conductive W fill 28 remains in trenches 12 and 14 following the etch process, which contributes to poor conductance of signal lines and results in signal delay and poor sensing in static random access memory (SRAM). Thus, good conduction of gate lines is very important in future fine feature devices.

As such, current art approaches are inadequate for at least the reasons described above.

SUMMARY

In general, embodiments of the invention provide an approach for bottom-up growth of a low resistivity gate conductor. Specifically, a low resistivity metal (e.g., aluminum or cobalt) is selectively grown directly over metal layers in a set of gate trenches using a chemical vapor deposition or atomic layer deposition process to form the gate conductor.

One aspect of the present invention includes a method for forming a device, the method comprising: forming a set of trenches in a dielectric material; forming a low-resistivity gate conductor over each of a set of metal layers in each of the set of trenches; and forming a capping layer over the low-resistivity gate conductor.

Another aspect of the present invention includes a method for forming a semiconductor gate stack, the method comprising: forming a set of trenches in a dielectric material; forming a low-resistivity conductive metal atop each of a set of metal layers in each of the set of trenches; and forming a capping layer over the conductive metal.

Another aspect of the present invention provides a device, comprising: a low-resistivity conductive metal formed directly atop each of a set of metal layers in each of a plurality of trenches in a dielectric material; and a capping layer formed over the low-resistivity conductive metal.

BRIEF DESCRIPTION OF THE DRAWINGS

These and other features of this invention will be more readily understood from the following detailed description of the various aspects of the invention taken in conjunction with the accompanying drawings in which.

Figure 1:
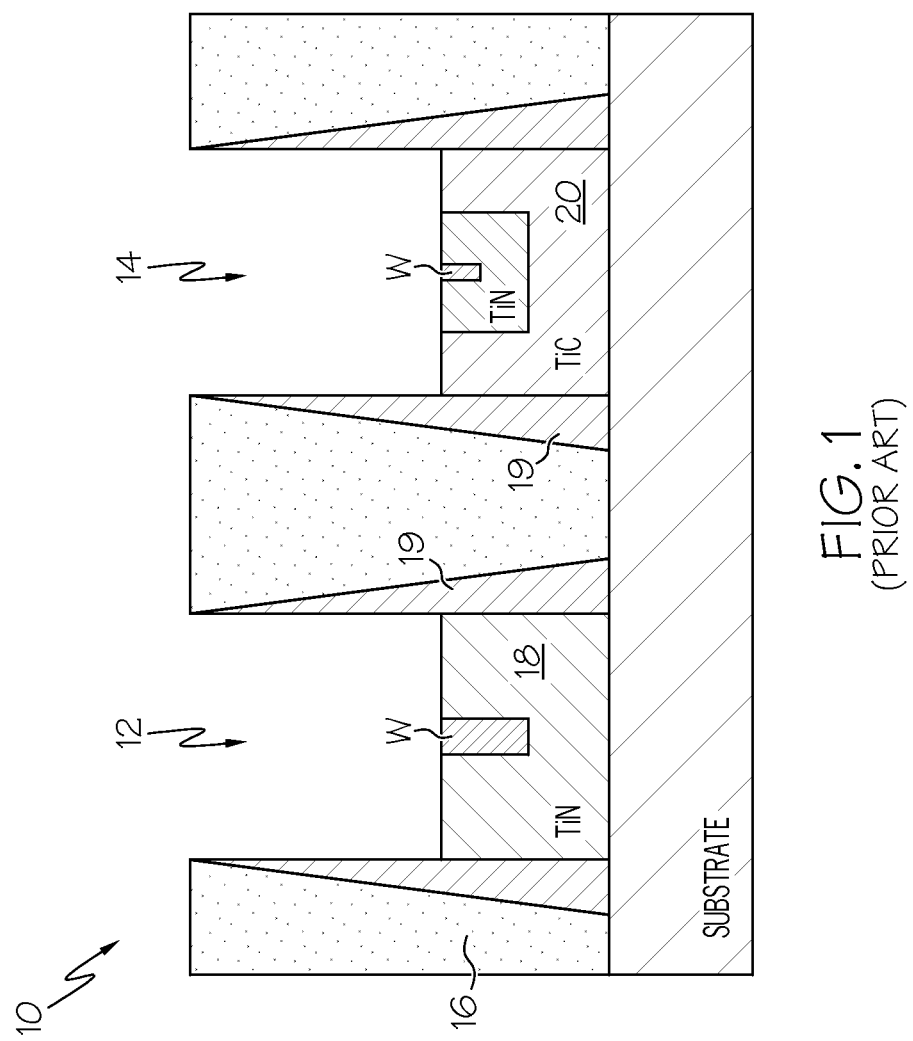
FIG. 1 shows a cross-sectional view of a prior art semiconductor device following a dual-recess etch.
Figure 2:
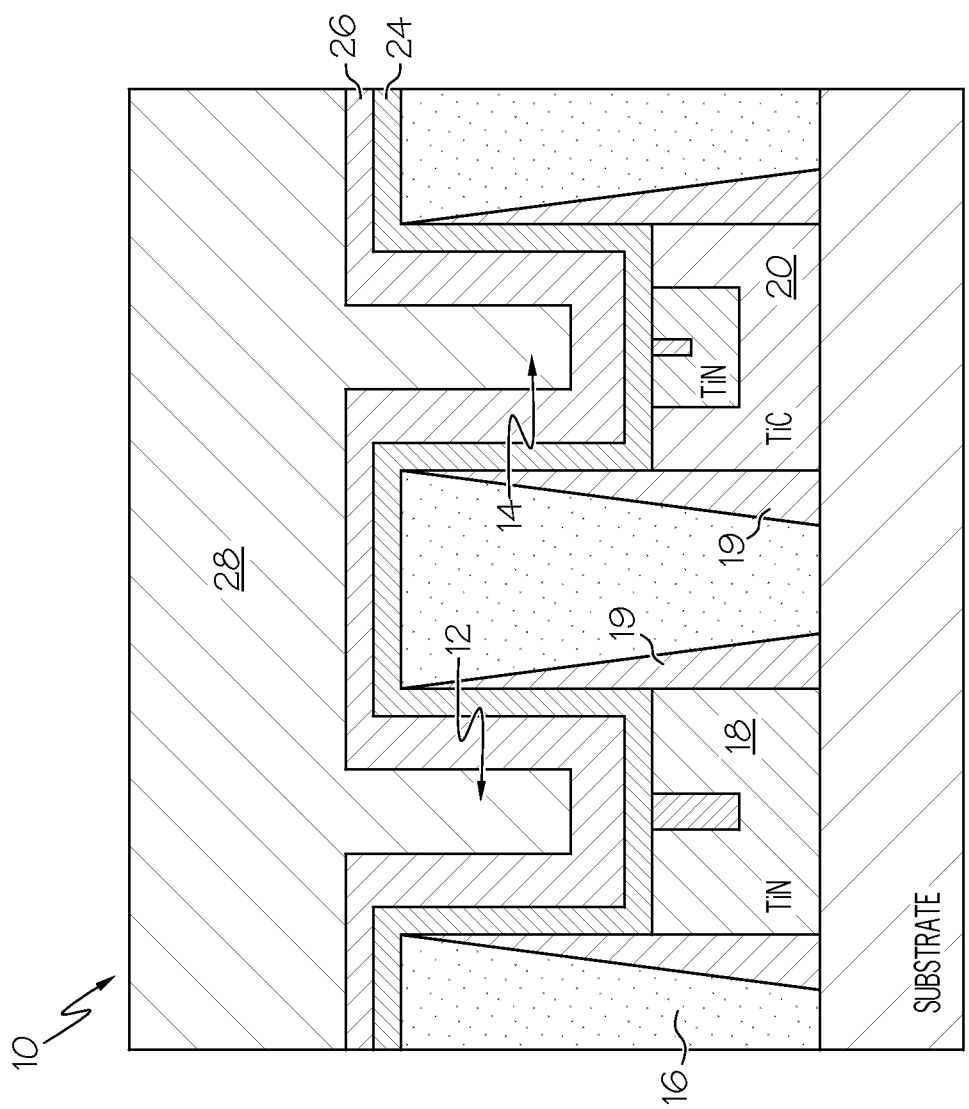
FIG. 2 shows a cross-sectional view of the prior art semiconductor device following formation of a barrier layer and a nucleation layer, and a W fill.
Figure 3:
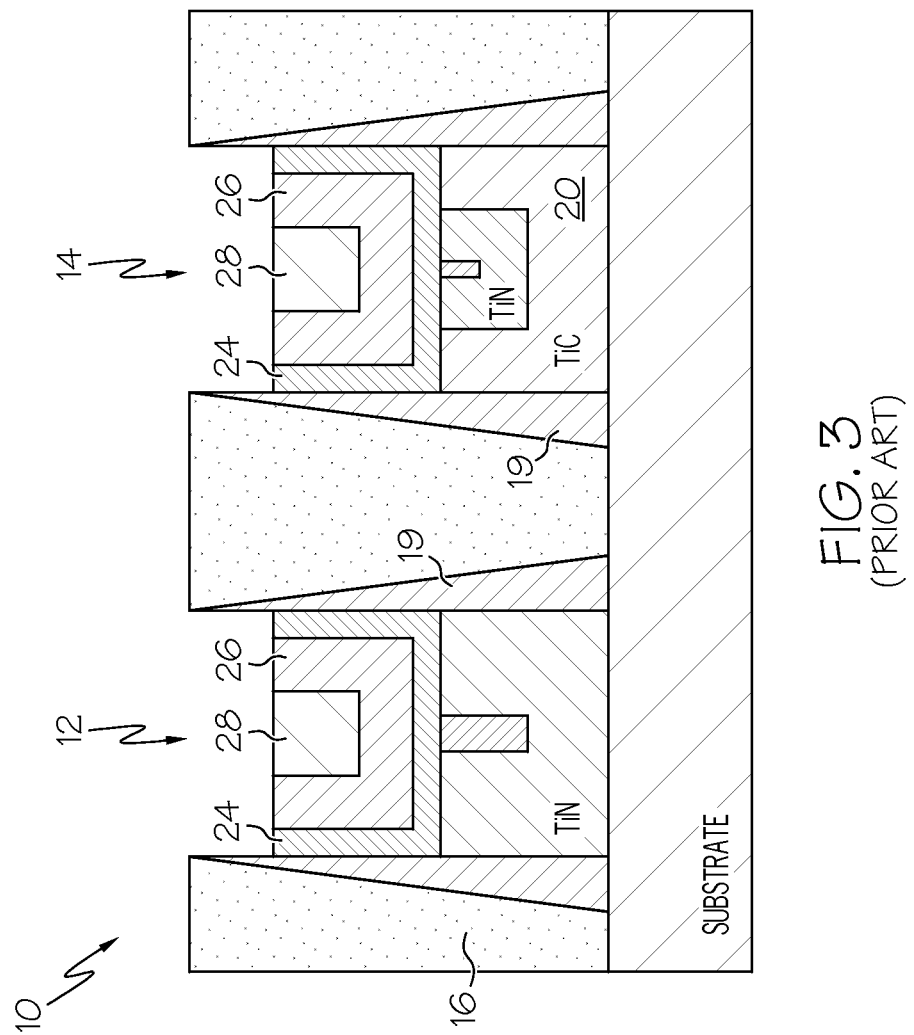
FIG. 3 shows a cross-sectional view of the prior art semiconductor device following an etch of the W fill.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which exemplary embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. For example, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, embodiments of the present invention relate to approaches for bottom-up growth of a low-resistivity gate conductor. Specifically, a low resistivity metal (e.g., aluminum (Al) or cobalt (Co)) is selectively grown directly over metal layers in a set of gate trenches using a chemical vapor deposition (CVD) or atomic layer deposition (ALD). To address current self-aligned contact formation and the continuing scale down in Fin FET metal gate stacks (e.g., 22 nm, 14 nm, 10 nm etc.), exemplary embodiments herein provide selective growth of the low resistivity gate conductor material for the next generation and beyond.

Figure 4:
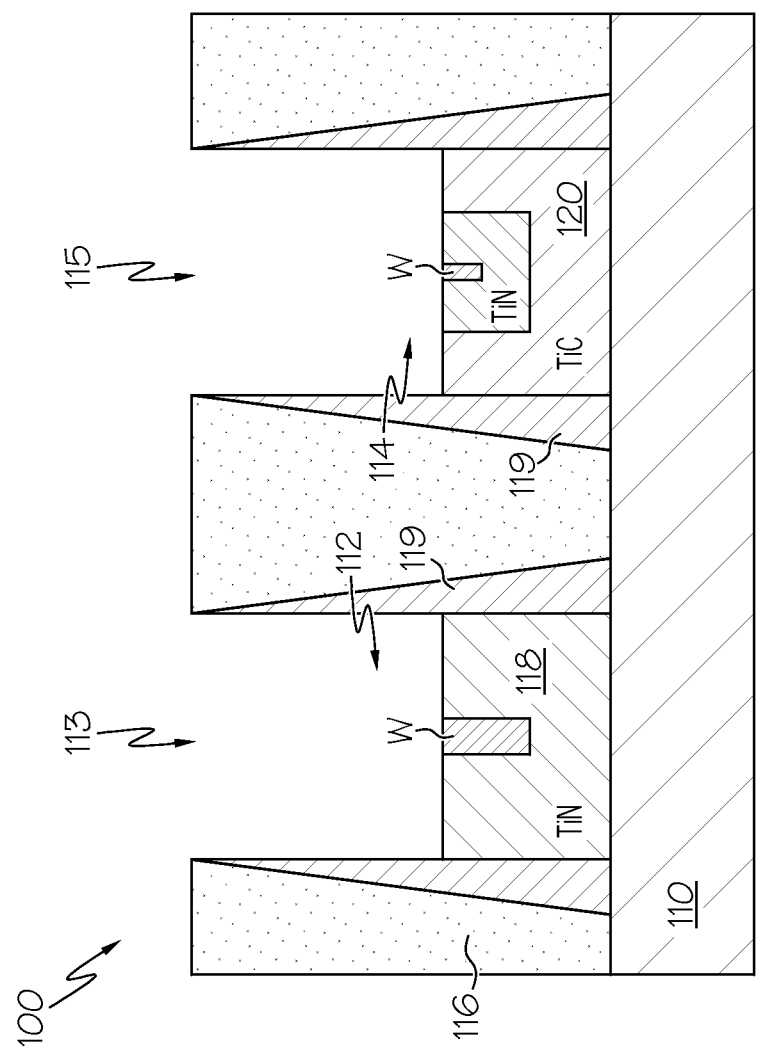
FIG. 4 shows a cross-sectional view of a device following a dual-recess formation according to illustrative embodiments.

With reference again to the figures, FIG. 4 shows a cross-section of a device 100 according to illustrative embodiments. Device 100 comprises a portion of an integrated circuit (IC) in which trenches 112 and 114 have been formed in a dielectric material 116 that is formed over a substrate 110.

Substrate 110 may be any silicon containing substrate including, but not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when substrate 110 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively be fabricated by an ion implantation process, such as separation by ion implantation of oxygen (SIMOX).

In one embodiment, openings 113 and 115 may be formed by patterning openings in a masking structure and optional anti-reflective layer (not shown), for example, using a photolithography processes or other lithographic process (e.g., electron beam lithography, imprint lithography, etc.). Device 100 may be partially formed, for example, in a lithographic stepper including multiple spin coating stations and at least one curing chamber so that the materials of the IC structure may be formed within the lithographic stepper in a single processing step. Alternately, multiple lithographic steppers and/or dedicated curing tools may be employed to form the IC structure.

Anti-reflective layers include materials that reduce light reflection at the wavelengths of illumination on the masking structure, and may be formed by any conventional method of forming a lithographic material layer, e.g., spin coating. In exemplary embodiments, the anti-reflective layer may include an organic material including a light absorber material and a polymer material. For example, anti-reflective layers may include a crosslinking agent component substituted by a hydroxylalkyl group or an alkoxyalkyl group, a benzophenone-based, diphenylsulfone-based or diphenylsulfoxide-based dye component and an acrylic resin. Anti-reflective layers may also be a Si-containing anti-reflection layer, i.e., include silicon in the composition of the material. The composition of anti-reflective layers may be optimized depending on the composition of the masking structure.

Masking structures are conventionally formed on the top surface of the anti-reflective layer, for example, by spin coating. Masking structures include materials that are photosensitive at a wavelength range. For example, the masking structure may include a deep ultraviolet (DUV) photoresist, a mid-ultraviolet (MUV) photoresist, an extreme ultraviolet (EUV) photoresist, or an electron beam (e-beam) photoresist. The material of the masking structure reacts to illumination and is chemically changed, for example, by cross-linking, in the wavelength range within which the masking structure is photosensitive. The masking structure may include a variety of types of masking structures. In one embodiment, the masking structure comprises refractive or reflective masking structures including, for example, optical, extreme ultraviolet (EUV), and/or x-ray technologies. Optical masking structures include, for example, 157 nanometer (nm), 193 nm, 248 nm, and/or 365 nm masks, but may also include masks suited for smaller geometries (i.e., 32 nm, 22 nm, and beyond). An optical masking structure may generally include materials such as quartz or various types of silica including fused silica and chrome, chrome oxide, and/or chrome oxynitride or molybdenum silicide, but may include other materials in other embodiments. An EUV masking structure may include a ruthenium (Ru) capped molybdenum silicon (MoSi) multi-layer blank among other materials and/or structures. EUV masking structures may also comprise a low thermal expansion material (LTEM). The masking structure may be used in immersion technologies in other embodiments.

In exemplary embodiments, dielectric 116 material may include, for example, oxide, nitride, silicon dioxide ($SiO_2$), oxynitride, dielectric material, high-k dielectric material or various combinations thereof. In some embodiments, the high-k dielectric can be one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

As shown in FIG. 4, dielectric material 116 is removed and metal layers 118 and 120 are formed within trenches 112 and 114, respectively. Although not shown for the sake of brevity, in exemplary embodiments, device 100 may be formed using a replacement metal gate (RMG) fabrication approach. For example, a polysilicon gate (not shown) may be formed over a region of substrate 110, a pair of sidewall spacers 119 being disposed on sidewalls of the gate. Dielectric material 116 over the polysilicon gate is removed, e.g., via chemical-mechanical planarization (CMP). Next, the polysilicon material is removed from between the pair of sidewall spacers 119, e.g., by a wet etch. This creates an opening between sidewall spacers 119 where metal layers 118 and 120 are then formed. In exemplary embodiments, metal layer 118 is a p-metal, which may include W surrounded by titanium nitride (TiN). Metal layer 120 is an n-metal, which may include W surrounded by TiN and titanium carbide (TiC), TaC or TiAl or other nMetal.

Figure 5:
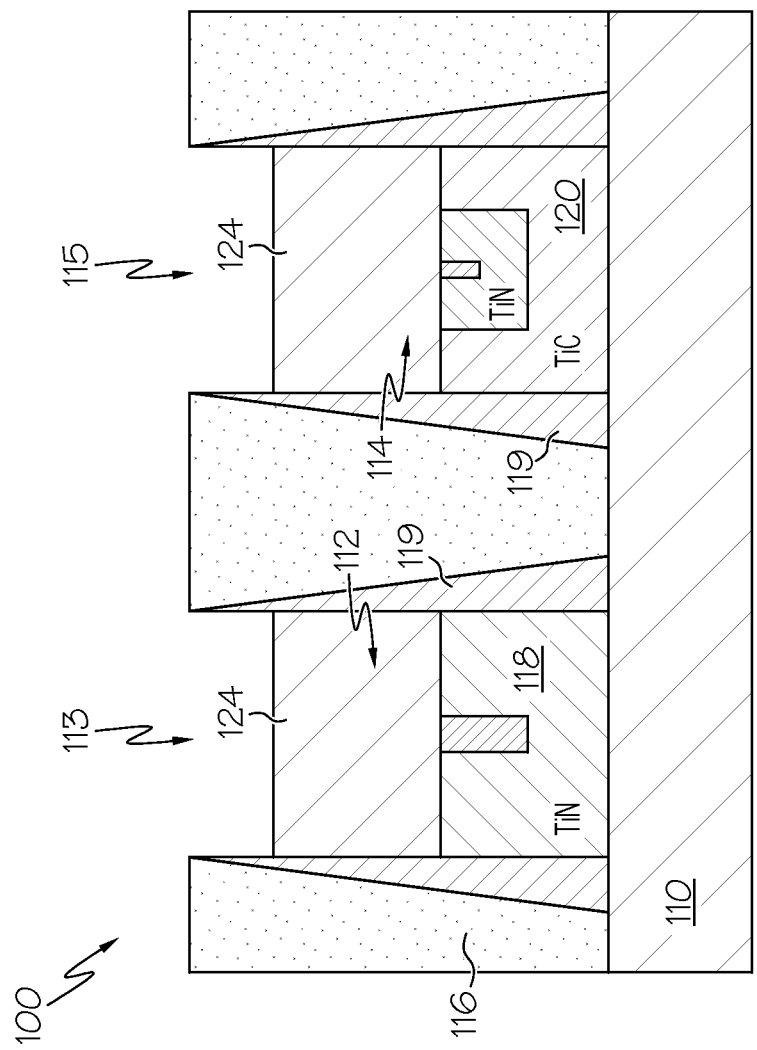
FIG. 5 shows a cross-sectional view of the device following formation of a low-resistivity gate conductor according to illustrative embodiments.

Next, as shown in FIG. 5, a gate conductor 124 is formed over metal layers 118 and 120 in each of trenches 112 and 114, respectively. In exemplary embodiments, gate conductor 124 includes a low-resistivity conductive metal formed via ALD or CVD. As known to those skilled in the art, CVD techniques utilize chemically reactive molecules that react on a surface to deposit a desired film. Reactants in CVD processes comprise volatile molecules that can be practically delivered, in the gas phase, to react on the surface to deposit a desired film. Optimum CVD performance directly correlates with the ability to achieve and sustain steady-state conditions of flux, temperature, and pressure throughout the process, in which unavoidable transients are suppressed or minimized. CVD has provided uniform and conformal coatings with reproducible thickness and high quality.

ALD is practiced by dividing conventional thin-film deposition processes into single atomic layer deposition steps that are self-terminating and deposit precisely one atomic layer when conducted up to or beyond self-termination exposure times. In one embodiment, an atomic layer typically equals about 0.1 molecular monolayer to 0.5 molecular monolayer. The deposition of an atomic layer is the outcome of a chemical reaction between a reactive molecular precursor and the substrate. In each separate ALD reaction-deposition step, the net reaction deposits the desired atomic layer and eliminates the "extra" atoms originally included in the molecular precursor. In a typical ALD process for depositing thin films, one deposition cycle comprises exposing the substrate to a first reactant, removing unreacted first reactant and reaction byproducts from the reaction chamber, exposing the substrate to a second reactant, followed by a second removal step.

As shown, gate conductor 124 is formed to partially fill trenches 112 and 114 using a selective growth CVD or ALD process. That is, the interface of gate conductor 124 and metal layers 118 and 120 serves as a nucleation site for promoting growth of gate conductor 124. Because of the selective nature of the Al/Co growth process, gate conductor 124 is gradually formed from the top surface of metal layers 118 and 120 upwardly. The growth rate is finely controllable due to the nature of the ALD process, which allows the thickness of gate conductor 124 to be precisely controlled. This reduces the need for a subsequent metal etch, which results in less damage to dielectric material 116 during recess etching, and reduces costs by eliminating this step.

Gate conductor 124 is formed such that its top surface is below a top surface of dielectric material 116. This is desirable in order to allow contact to be made to source regions along upper sidewalls of trenches 112 and 114. This ensures that a large portion of the sidewall of each trench is available for forming a low resistance contact with the source regions.

Figure 6:
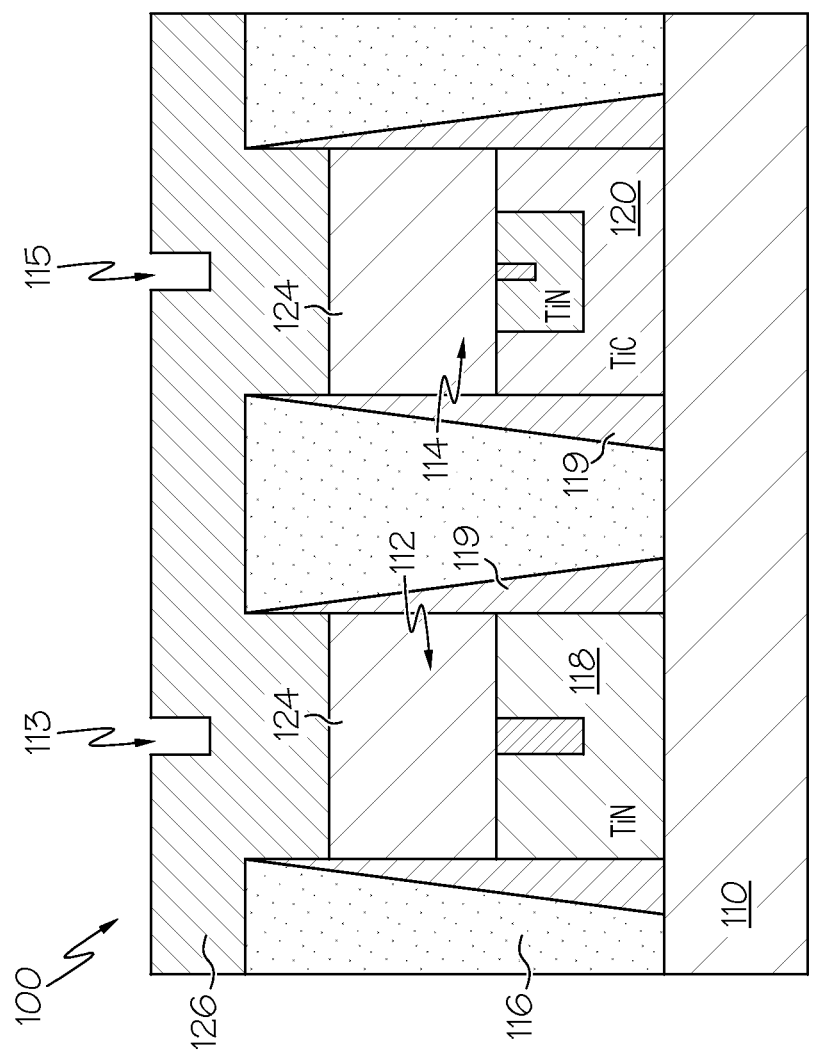
FIG. 6 shows a cross-sectional view of the device following formation of a capping layer over the low-resistivity gate conductor according to illustrative embodiments.

Next, as shown in FIG. 6, a capping layer 126 is formed over gate conductor 124 and dielectric material 116. In one embodiment, capping layer 126 comprises silicon nitride ($SiN_x$) conformally deposited to have the same pattern as the underlying structure. In another embodiment, capping layer 126 is blanket deposited over the entire device 100, and etched to the desired structure. Capping layer 126 suppresses the surface diffusion of copper and other metals used for conductive lines of device 100. Furthermore, capping layer 126 functions as a barrier layer to prevent diffusion of the metal from conductive lines into adjacent insulating material layers, and optionally functions as an etch stop layer for a damascene processes, for example. It will be appreciated that other materials for capping layer 126 are possible within the scope of the invention including, but not limited to: $SiC_xN_yH_z$, bilayer of Ta/TaN, W, Ti, TiN, Ta, TaN, TiW, Al, CoWP, or CoP. Insulating capping layers comprised of SiN, and $SiO_2$ are also possible.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches low-resistivity gate conductor formation. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
   forming a set of trenches in a dielectric material;
   forming a low-resistivity gate conductor atop each of a set of metal layers in each of the set of trenches, the low-resistivity gate conductor directly abutting a set of sidewall spacers of the set of trenches; and
   forming a capping layer over the low-resistivity gate conductor.

2. The method according to claim 1, the forming the set of trenches in the dielectric material comprising performing an etch.

3. The method according to claim 1, the set of metal layers comprising at least one of: titanium nitride and titanium carbide.

4. The method according to claim 1, the low-resistivity gate conductor comprising at least one of: aluminum, cobalt, and nitride.

5. The method according to claim 1, the forming the low-resistivity gate conductor comprising one of: atomic layer deposition, and chemical vapor deposition.

6. The method according to claim 1, the capping layer comprising silicon nitride.

7. The method according to claim 1, wherein the dielectric material comprises a high-k dielectric.

8. A method for forming a semiconductor gate stack, the method comprising:
   forming a set of trenches in a dielectric material;
   forming a low-resistivity gate conductor atop each of a set of metal layers in each of the set of trenches, the low-resistivity gate conductor directly abutting a set of sidewall spacers of the set of trenches; and
   forming a capping layer over the low-resistivity conductive metal.

9. The method according to claim 8, the forming the set of trenches in the dielectric material comprising performing an etch.

10. The method according to claim 8, the set of metal layers comprising at least one of: titanium nitride, and titanium carbide.

11. The method according to claim 8, the low-resistivity conductive metal comprising at least one of: aluminum, cobalt, and nitride.

12. The method according to claim 8, the forming the low-resistivity conductive metal comprising one of: atomic layer deposition, and chemical vapor deposition.

13. The method according to claim 8, the capping layer comprising silicon nitride.

14. The method according to claim 8, wherein the dielectric material comprises a high-k dielectric.

15. A semiconductor device, comprising:
   a low-resistivity conductive metal formed directly atop each of a set of metal layers in each of a plurality of trenches in a dielectric material, the low-resistivity gate conductor directly abutting a set of sidewall spacers of the set of trenches; and
   a capping layer formed over the low-resistivity conductive metal.

16. The device according to claim 15, wherein the plurality of trenches in the dielectric material are formed by an etch.

17. The device according to claim 15, the set of metal layers comprising at least one of: titanium nitride, and titanium carbide.

18. The device according to claim 15, the low-resistivity conductive metal comprising at least one of: aluminum, cobalt, and nitride.

19. The device according to claim 15, the low-resistivity conductive metal formed by one of: atomic layer deposition, and chemical vapor deposition.

20. The device according to claim 15, the capping layer comprising silicon nitride, and the dielectric material comprising a high-k dielectric.

* * * * *